(12) United States Patent
Zorzet

(10) Patent No.: US 12,724,933 B2
(45) Date of Patent: Sep. 1, 2026

(54) DATA PROCESSING METHOD AND APPARATUS

(71) Applicant: Valentina Zorzet, Trieste (IT)

(72) Inventor: Valentina Zorzet, Trieste (IT)

(73) Assignee: VZ COMPLIANCE SRL, Trieste (IT)

( * ) Notice: Subject to any disclaimer, the term of this patent is extended or adjusted under 35 U.S.C. 154(b) by 893 days.

(21) Appl. No.: 18/017,425

(22) PCT Filed: Jul. 13, 2021

(86) PCT No.: PCT/IT2021/050216
§ 371 (c)(1),
(2) Date: Jan. 23, 2023

(87) PCT Pub. No.: WO2022/018775
PCT Pub. Date: Jan. 27, 2022

(65) Prior Publication Data

US 2023/0274046 A1 Aug. 31, 2023

(30) Foreign Application Priority Data

Jul. 23, 2020 (IT) ........................ 102020000017806

(51) Int. Cl.
*G06F 30/13* (2020.01)

(52) U.S. Cl.
CPC .................................... *G06F 30/13* (2020.01)

(58) Field of Classification Search
CPC ........ G06F 30/13; G06Q 10/08; G06Q 10/10; G06Q 50/08; G06Q 10/04
See application file for complete search history.

(56) References Cited

U.S. PATENT DOCUMENTS

2014/0180755 A1* 6/2014 Prieto ................ G06Q 10/0635 705/7.28
2017/0329876 A1 11/2017 Cockburn et al.
2022/0156425 A1* 5/2022 Haahtela ................. G06F 30/13

FOREIGN PATENT DOCUMENTS

WO 2012167267 A2 12/2012

OTHER PUBLICATIONS

Mahamadu, Abdul-Majeed, et al. "The importance of BIM capability assessment: An evaluation of post-selection performance of organisations on construction projects." Engineering, Construction and Architectural Management 27.1 (2020): 24-48. (Year: 2019).*
International Search Report and Written Opinion issued Oct. 25, 2021 in PCT/IT2021/050216.

* cited by examiner

*Primary Examiner* — Chuen-Meei Gan
(74) *Attorney, Agent, or Firm* — Panitch Schwarze Belisario & Nadel LLP

(57) ABSTRACT

Method to process data relating to a building, said method being based on information models and providing to execute a processing by means of an electronic apparatus, said electronic apparatus including at least one or more processing units, one or more electronic memories, devices for interfacing with a user and communication systems. Said method provides at least the steps of identifying locations and subjects, assessing the risks and performances relating to the building and the step of comparing the model created with the state of affairs ascertained on site. A data processing program able to implement said data processing method and an electronic apparatus able to execute said method are also included.

12 Claims, 3 Drawing Sheets

3.B
NO
SI
E.1
E.2

3.A
NO
SI
D.1
D.2
D.3

2.A
NO
SI
C.1
C.2
C.3
C.4

1.B
NO
SI
B.1
B.2
B.3

1.A
NO
SI
A.1
A.2
MOD. A1

DATA PROCESSING METHOD AND APPARATUS

CROSS-REFERENCE TO RELATED APPLICATIONS

This application is a Section 371 of International Application No PCT/IT2021/050216, filed Jul. 13, 2021, which was published in the English language on Jan. 27, 2022, under International Publication No. WO 2022/018775 A1, which claims priority under 35 U.S.C. § 119(b) to Italian Application No. 102020000017806, filed Jul. 23, 2020, the disclosures of each of which are incorporated herein by reference.

FIELD OF THE INVENTION

Embodiments described here concern a computer implemented method to process data relating to buildings, for example in the building trade, the field of civil works, infrastructures, roads, bridges or suchlike.

These data comprise information relating to a building, from the initial design to construction on site, to management for maintaining the functionality of the building during its useful life, up to demolition and disposal.

The data processing method described here is, in particular, able to be used in the design and/or modification phases of the building and/or to monitor the progress of its performance over time. The method described here, in particular, takes into account the use made of the building whose data is subject to processing.

Embodiments described here also concern a data processing program able to implement the method, and an electronic apparatus able to execute the program.

BACKGROUND OF THE INVENTION

In the construction sector, the possibility of using methods and software to support their design is known: one example is the software developed in the BIM environment, acronym for "Building Information Modeling", or rather software that contributes to the realization of information models relating to a building.

BIM modeling consists not only of a three-dimensional graphic representation of the building, but also a digital representation of physical and functional characteristics of "objects": it is an operational methodology that comprises programming, design, construction and maintenance of a building.

A virtual information model of the building is used, in which all the information concerning the entire life cycle of the building is collected and contained: from the project to the construction of the work, to all the stages of its "physical life", up to demolition and disposal.

Visually the designer, or more generally the BIM professional, has to deal with a virtual 3D model, but in reality each "BIM component" inserted in the BIM model consists of a series of parameters, which describe and distinguish it (parametric model).

In summary, thanks to the BIM methodology, the work is "created" in a virtual model, before it is physically constructed, through the collaboration of all the actors involved in the project: the information model is created to be interdisciplinary, shared and in continuous evolution during the entire life cycle of the building.

In order to promote this cooperative approach between different professionals, the latter work on "BIM compatible"

software, or on "open" standards, formats and workflows, which allow the technicians involved in a project to share the data and information: interoperability between these softwares is made possible by the IFC standard format created and promoted by Building SMART International.

The BIM approach allows to significantly improve the "management" of the work, optimizing time and costs, especially in the transition between the different macro-phases of its life (design—construction on site—use and maintenance) and through the sharing of information between multidisciplinary subjects.

BIM, and in general the current support methods and software, offer the opportunity to overcome some limits of "traditional" design, including the impossibility or at least the difficulty of objectively evaluating, prior to implementation, the real effectiveness of many technological solutions chosen. Software that allows to estimate the effectiveness of a single component, "object" or plant, or system of components, is now widespread on the market, but this software, in turn, takes into account a single factor or a very limited set of performances, and suffers from the fact that it does not take into consideration the impact that a set of factors or a set of design choices can have on the quality of the construction of the work. A building is a complex "organism", in which all its parts are connected and communicating with each other: to date there are still no tools that provide the ability to estimate the impact of a harmonious choice of technological solutions as a whole. Above all, there is no software that allows to estimate the quality of the choice of technological solutions, prior to implementation on site, depending on the use to which the building is intended.

The software on the market often also suffers from the fact that it only supports the design phase and not the entire life cycle of the building, without providing a monitoring of the maintenance over time of such performances or of a subsequent improvement thereof.

In particular, some software known on the market builds a predictive model and then associates it with monitoring systems that allow to re-calibrate the model according to the performances detected, for example crowd or traffic simulators. However, this software is dedicated and does not offer an evaluation of performances referring to a wide field of application as described by the present method.

There are also systems for tracking building components, such as for example in document WO-A-2012/167267, which allow to monitor the evolution over time of the characteristics of the elements of the building, once in place, and therefore to provide information on the trend of their performance over time. In this case, even if it is possible to have a system to manage the building based on the recorded data, and to record data that can be used to improve the management of the building itself or subsequent designs, no preliminary evaluation is provided of the performance of the structure and no account is taken of the use made of it.

Another disadvantage of current methods is that, since they do not provide an overview of the impacts, for example on the intended use of the structure, and of the design choices made, especially in some specific fields of application, it is often not possible to make a satisfactory forecast of the costs and resources to be used in the subsequent management and maintenance phase of the work: the absence of a methodological approach to evaluate the effectiveness of the technological solutions chosen (for example based on risk management) creates a discontinuity between the design phase and subsequent stages of its life.

For example, in the area of health and safety (HS), the assessment of risks relating to the workplace is carried out only after the work has been handed over to the manager, and is now complete: this late evaluation often requires the manager to spend time and resources in the in-depth analysis of the building, to reconsider the organizational models adopted and sometimes even to make changes to the building itself, in order to adapt it to the requirements that current legislation requires, with increased costs and the concrete possibility that the harmony of the building as it was originally conceived may be distorted.

With current methods it is not possible to establish, at least in the planning stage, a correspondence between the risk assessment in the area of HS, and/or in other areas of application, and the performance of the elements of the building, which on the contrary would allow to evaluate the appropriateness of the technological solutions chosen in correspondence with the actual needs of the user, today only partly taken into consideration through the application of regulatory standards.

It is believed that, in the HS area or also in other areas such as environmental protection, the outcome of the assessment of a risk as at least acceptable, that is, a level of performance of the building considered at least acceptable in these areas, is, in fact, a fundamental requirement to which a building must correspond.

Today there is the possibility of associating risk assessment software (in the HS area) to BIM models, but it is a mere comparison between parametric models, a sort of identification of "interferences" between BIM objects (clash detection), and not a risk assessment process, that is, a real evaluation of the impact of the technological solutions implemented in the design on the subsequent management of HS aspects, and in particular this known approach does not achieve a process of identification, analysis and risk assessment.

There is therefore a need to perfect a data processing method relating to a building which can overcome at least one of the disadvantages of the state of the art.

In particular, the purpose of the present invention is to provide a data processing method that allows an objective assessment of the risks and performances of the building or a part thereof, relating to a specific area of investigation, on the basis of data which comprise information related to the building, contained in the parametric BIM models. This method can be used at any stage in the life of a building. In particular, the method described here is based on the intended use of the building once it is built and during its subsequent life.

The main purpose is therefore to optimize the choice of technological solutions in the design phase, having a predictive model of their impact in terms of performance on the subsequent stages of the life of the work, and to be able to monitor the performances throughout the useful life of the building.

Another purpose is also to optimize the forecast of the times and costs of managing resources and to create a common thread, a continuous solution, between design choices and subsequent management of the work.

By implementing this predictive model to support the design, the purpose is also to significantly improve the sustainability of the work: as already said, on an economic level, but also in different areas, such as for example health and safety (HS), protection and respect for the environment, or, more generally, in terms of the appropriateness of the technological choices made to the needs of the target users who will use the work, currently considered systematically only as mere compliance with regulatory standards.

Unlike known building management systems (for example, a three-dimensional management system based on the availability and analysis of historical and real-time data of the building, as shown in document US-A-2017/0329876), the method described here is in particular based on the use of the same building being analyzed, carrying out an evaluation of the level of performances of the building or part of it, prior to its construction or change, where the building, which is in practice represented in the BIM model as a set of objects, is intended as a "physical place", with particular characteristics that affect the possibility of use of the building by users and/or the expected performances.

The Applicant has devised, tested and embodied the present invention to overcome the shortcomings of the state of the art and to obtain these and other purposes and advantages.

SUMMARY OF THE INVENTION

The present invention is set forth and characterized in the independent claims, while the dependent claims describe other characteristics of the present invention or variants to the main inventive idea.

In accordance with the above purposes, embodiments described here concern a computer implemented method to process design data of buildings, which overcomes the limits of the state of the art and eliminates the defects present therein.

In accordance with the above purposes, the embodiments described here also concern a program for processing data suitable to implement said method and to an electronic apparatus suitable to execute said program.

According to some embodiments, the method, the program and the apparatus are able to execute a risk assessment of the building or a part thereof, in relation to one or more selected areas of investigation and, correspondingly, a predictive/decision-making activity of design choices. In particular, they are able to execute a step of assessing the response level of the building with performances to determinate requirements, relating to different areas of investigation, taking into account the intended use of the building.

They are also able to monitor the progress over time of these risks and the relevant performances of the building.

The method according to the present invention comprises executing a processing by means of an electronic apparatus that comprises one or more processing units. The one or more processing units are provided with a modeling module and an analysis module. The one or more processing units can also be provided with a possible virtual representation module.

The processing as above executed by the method of the present invention provides that:

- the modeling module executes a modeling of the building or a part thereof, which comprises at least one step of identifying one or more locations, characterized and identified by the objects of which they consist, and one or more subjects;
- the analysis module executes an analysis of the building modeled by the modeling module as above, by means of at least one step of objective assessment of one or more risks related to the building, correlated to a specific area of investigation, processing by means of calculation algorithms, based on one or more of either physical laws, mathematical formulas, correlation tables, probability distributions, a set of relationships between the characteristics of the objects and/or between characteristics of the objects and subjects that interact with the objects.

By subjects that interact with the objects we mean subjects (or families of subjects), with the same characteristics of the objects (that is, parametric models), which constitute the virtual transposition of possible users of a building, in the life stages following the design.

The one or more risks related to the building as above correspond to the uncertainty in reaching correspondence to determinate requirements with performances of the building as a function of the needs relating to one or more areas of investigation.

Furthermore, the requirements referring to each area of investigation as above, to which the building responds with respective performances, are explained and described qualitatively with parametric models in the form of risks or performances.

In carrying out the assessment as above, the analysis module relates the results of the risk assessment with corresponding performances of the building.

By means of the modeling and analysis of the building or a part thereof modeled by the modeling module as above, the method provides to execute the predictive/decision-making activity of the design choices relating to the building on the basis of data relating to information on the objects available in all the life stages of such building, from design, to construction, to management up to its demolition and disposal, also taking into account the intended use of the building itself, including any possible choices to modify/move objects within the locations during the use of the building.

In particular, the objective risk assessment, or measurement, as above can be executed by means of calculation algorithms that establish a system of relationships between objects and objects and/or between objects and subjects: the objects are inserted in the BIM design model of the building; the subjects can be pre-set in the program or defined by the user and related to the objects; the calculation algorithms can be used over the entire useful life of the building.

Bringing forward the risk assessment to the design phase, correlated to one or more selected areas of investigation, is a considerable advantage because it allows to set the foundations for risk management, creating a continuity solution between the different macro-phases of the life of the artefact, which are otherwise not linked, with a savings in time and costs, especially in the passage between such macro-phases. The method, in fact, proposes to start a risk management during the very conception of a building, the design, which allows to better manage and monitor its performances during the entire life cycle, as a function of the use of the building itself.

One advantage is reducing building management times and costs, anticipating analyzes and assessments that would be taken into consideration only once the building were completed: for example, reducing or completely eliminating any additional costs for adapting the building to specific user needs or requirements that had not been analyzed, or for the application of regulations in force in areas not taken into consideration during design (e.g. need to reorganize spaces, replace/integrate materials, etc.).

One advantage is to be able to objectively determine the performance levels of the building components, as a function of the risk assessment carried out, and therefore to be able to choose, even at the same cost, the technological solutions that better respond not to a single one, but to a plurality of needs of the user and/or manager.

According to some embodiments, this assessment can be carried out prior to the construction of the building and/or prior to the execution of a modification thereto: this provides the advantage of benefiting from an objective method that also allows to predict the impacts of any possible changes/readjustments of the structure during its useful life (e.g. the insertion of a new element, changes in the intended use of a space, an extension of the structure) and to make, at any time, choices that optimize the performances desired.

According to some embodiments, the analysis module as above can support the modeling module in the step of identifying one or more locations, characterized and identified by the objects of which they consist, and one or more subjects.

According to some embodiments, the method described here also provides to be able to verify, at any time, the state of affairs relating to the risks and performances investigated, by comparing a virtual BEAM (Building Environmental Assessment Model, that is, the model created by the program) created with the outcome of detections and measurements carried out on site (for example, by means of interaction with other devices, detection systems, software, etc.). The method therefore offers the advantage of being able to monitor the progress of the performances of the artefact over time and therefore being able to plan and optimize the management of resources, at any time during the useful life of the work, as a function of performance levels and situations of risks found during construction, defining short and long-term objectives to be achieved and keeping under control any risks/performances deemed unsatisfactory or unacceptable.

The management and ordinary maintenance over time of a building (for example an edifice) also require drawing on information coming from the previous macro-phases of design and construction (for example how much weight can be placed on a floor and with which loading modes): this information may not be immediately available or may even not be available at all. For that matter, the availability of information relating to objects is one of the aims of the BIM environment; however, in general, it is a question of characteristics of the objects and not of modes of use associated with them or with the building. One advantage is therefore the possibility of defining and making available, during the risk assessment, a series of boundary conditions, that is, information relating to the modes of use of the building, organized, able to maintain, or even improve, the level of risk and/or performance desired: the set of such information can constitute, in the chosen area of investigation, a sort of "user manual" of the artefact.

According to some embodiments, this information can be made available in a simple and immediate manner (at each step of the life cycle of the building) through tables, in the form of text and/or by means of graphical representations and/or within an actual virtual reality of the building: the latter can be achieved by means of the interaction of the program with a basic software or by means of a dedicated virtual representation module.

One advantage is that the subject is free to move within this virtual reality because this allows to create real simulations of reality within the virtual environment.

These virtual experiences of the real world are already used for training purposes, even in the BIM environment: this method can allow a user to organize cognitive paths aimed at a user base of the building concerned (represented virtually by subjects), for example organized as a function of a risk assessment or performance levels and/or aimed at learning specific boundary conditions.

For example, again on the subject of HS, it is possible, with the support of devices (e.g. tablets, smartphones, smart glasses, etc.) to organize a virtual cognitive path of the building for an external maintenance technician, or a newly hired worker, who do not know the building, before accessing it, providing them with the information deemed necessary for the planned activity (access routes, restricted areas, information relating to a workstation or systems with which they interact, etc.).

In a possible subsequent evolution of the present invention, it will be possible to develop a real virtual interaction of the subject even with some objects of the building (e.g. buttons, furnishings, etc.), in order to make the virtual experience of real reality more and more interactive (e.g. simulations of ordinary or emergency scenarios in which the structure is used). Although virtual interaction with the information associated with the objects is already known in the BIM environment (also for training purposes), in general it is not used to describe modes of use of a building.

The areas of investigation, and therefore of application of the method, can be different, for example protecting and safeguarding the environment or energy saving, health and safety of workers or suchlike.

In the present disclosure, we will mainly analyze, by way of example, applications in the HS and Accessibility fields: however, the method is not to be intended as being limited exclusively to these fields and corresponding user base.

BRIEF DESCRIPTION OF THE DRAWINGS

These and other aspects, characteristics and advantages of the present invention will become apparent from the following description of some embodiments, given as a non-restrictive example with reference to the attached drawings wherein.

To facilitate comprehension, the same reference numbers have been used, where possible, to identify identical common elements in the drawings. It is understood that elements and characteristics of one embodiment can conveniently be incorporated into other embodiments without further clarifications.

DETAILED DESCRIPTION OF SOME EMBODIMENTS

Figure 1:
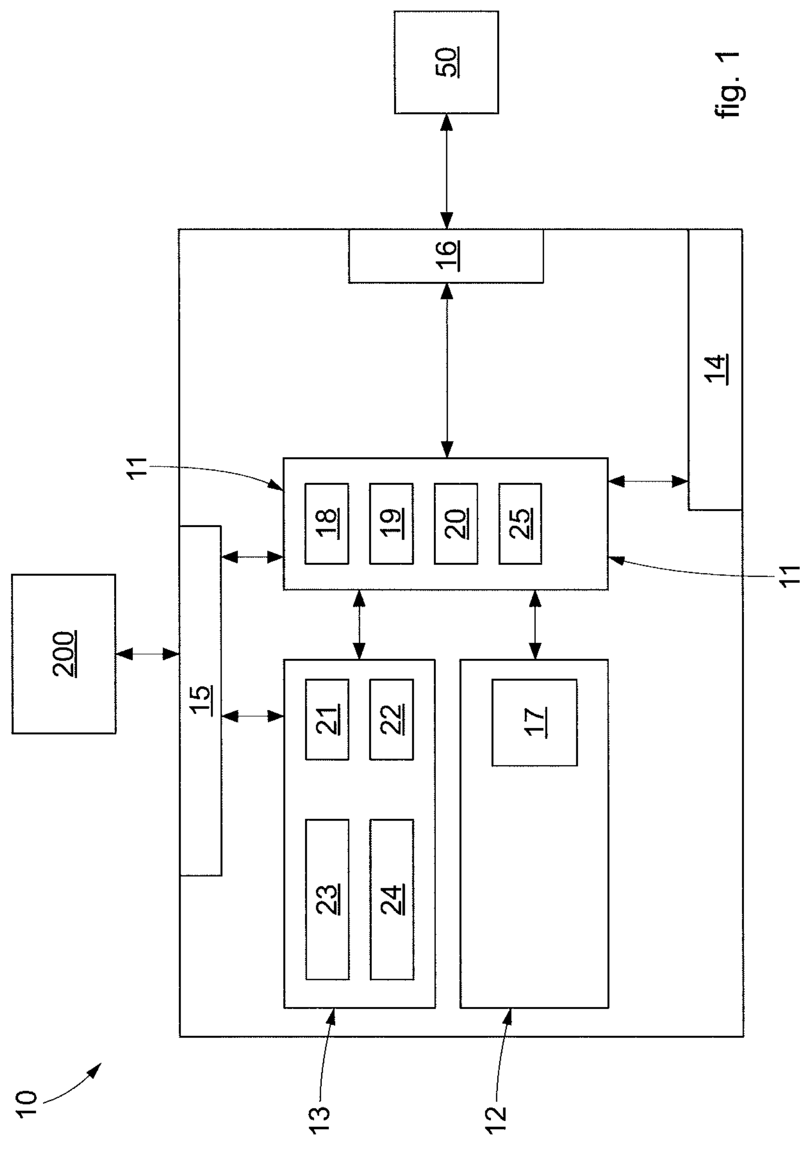
FIG. 1 is a block diagram of an electronic apparatus according to some embodiments described here.

We will now refer in detail to the possible embodiments of the invention, of which one or more examples are shown in the attached drawings, by way of a non-limiting illustration. The phraseology and terminology used here is also for the purposes of providing non-limiting examples.

Here and hereafter in the description, in order to better describe the method of the present invention, although they can normally be used with different meanings, the terms below will be associated with the following definitions.

"Building": construction or road work, infrastructure work, civil engineering work or suchlike;

"Program": software with which the method to process data object of the present disclosure is implemented;

"Basic software": software with which the program can interact, as an extension of the corresponding applications and/or dashboards;

"Component": constructive element of a more complex system; in this case, we mean a construction or plant or structural element, or a system of elements that is part of a building, which can be prefabricated or not;

"BIM component": "component" contextualized in the BIM (Building Information Modeling) environment, that is, defined by a number of qualitative parameters variable in relation to the performances thereof;

"Object": within this disclosure, by object we mean a "BIM component", but also, especially in the phases that follow the design and construction of the building, we will mean furnishings, lighting fixtures, signals, machinery, vehicles, materials, products, overall sizes, temporary works, objects in general and suchlike, which can be inserted in the virtual physical environment of the BIM project, similarly characterized by a number of qualitative parameters variable in relation to the performances thereof;

"Macro-phases of the building": we mean the design phase, the construction phase, and the management/use/maintenance phase, that is, the life of the work, once built, until its disposal;

"User": whoever uses/visits/benefits from/relates to a building, interacts with it;

"Subject": subject (or family of subjects), with the same characteristics of an object (or parametric model), which constitutes the virtual transposition of a possible user of a building, in the life stages following the design. Some examples: a visitor, a maintenance technician, a worker, the driver of a vehicle or, if the construction is a road, even the vehicle itself. In one variant of the method described here, in some areas the concept of "subjects" can also be extended to parametric models, different from the virtual transposition of "physical" subjects, which, when related to objects, can determine levels of risks and/or performances that are object of the assessment;

"Manager": organization or natural person who manages and maintains the building, or a part thereof, once built (e.g. the owner, etc.);

"BIM Professional": any technician who carries out activities in the BIM environment and is confronted during the life of the building with the information model relating thereto, in order to design, modify the virtual environments, update, complete, modify the information of the model;

"BIM Model": information model relating to the building created with the basic software;

"BEAM" (Building Environmental Assessment Model), that is, the model created by the program: information model relating to the building, which can comprise information relating to objects, the parametric models that describe the locations, subjects, risks and performances associated with the artifact;

"Area": understood as the area of investigation, a set of characteristics and aspects to be analyzed, such as, for example, the HS area or the Accessibility area;

"HS" (Health & Safety) area: area relating to the safety and health of workers or also, more generally, of people (in the workplace or not);

"Need": what is required for the normal performance of an activity or the satisfaction of an elementary or complex necessity (for example the needs of the users of a building);

"Requirement": transposition of a need into a set of characters that characterize it (measurable, geometric-dimensional): usually carried out by the designer of a building;

"Performances": in construction, behavior in the use of an element, of a component of a building referred to the characters that characterize a requirement. In the present disclosure, the definition will be extended by referring to the behavior in the use of what in reality corresponds to an object;

"Risks relating to the building": uncertainty in reaching the objectives, that is, in this case, in reaching the correspondence to some requirements with the performances of the building, for example the response to some specific needs of users in an area of application;

"Acceptable risk": we refer to acceptable risk when the extent of the risk is such that it is accepted, that is, the performance meets some minimum requirements ("acceptable level of performance");

"Locations": in BIM models, the components of the building are represented as parametric models of objects. However, in the real world a user (e.g. a person), moves within "locations", or spaces, intended as environments inside and/or environments outside a building or characterized by the presence of the building or a part thereof (e.g. external and internal features of an edifice, a stretch of a road, etc.).

Embodiments described here, using the attached drawings, concern a method 100 to process data relating to buildings, as defined above, a program for processing data able to implement the method and an electronic apparatus 10 able to execute the program, hereafter referred to as method 100, program and apparatus 10.

According to some embodiments, the method 100 and program are applied to information models relating to a building, and can be implemented by means of a BIM or BIM compatible program, according to the present invention.

According to some embodiments, the method 100, the program and the apparatus 10 can be able to perform a predictive/decision-making activity of the design choices related to the building and an activity of assessment of the response level of the building with performances to determinate requirements in different areas of investigation, taking into account the intended use of the building, including any choices to modify/move the objects inside the locations during the use of the building.

In particular, they can be able to process data relating to information drawn from basic software and to be used in the design and/or modification phases of the building throughout the entire useful life of the work (from design, to construction, to management up to its demolition and disposal), taking into account the use of the building itself, including any choices to modify/move the objects inside the locations during the use of the building.

The one or more risks as above relating to the building correspond to the uncertainty in reaching correspondence to determinate requirements with performances of the building as a function of the needs relating to one or more areas of investigation.

The requirements as above referring to each area of investigation, to which the building responds with respective performances, are made explicit and qualitatively described with parametric models in the form of risks or performances.

During the design of a work, the designer sets him/herself the objective of responding to requirements with performances, that is, with the behavior in the use of elements of the building in correspondence with the characters that characterize these requirements. Examples of requirements are needs of a regulatory, dimensional or functional nature, quality standards, or even simple requests from the buyer of the work.

In the present description we propose an objective predictive/decision-making method to assess the level of response of the building with performances to determinate requirements in different areas of application, taking into account the intended use of the work. For example, if the requirement corresponds to the need of the buyer to have an edifice that is "safe" when users use it, the method described here proposes a qualitative classification of the requirements, for example absence of trip hazards, possibility of slipping reduced to a minimum, adequate lighting, etc. By relating the dimensional and physical characteristics of the objects, which characterize the locations and which are accessible in the model, as well as their position therein (for example the presence, position and characteristics of the light sources), with other objects and the intended use of the environments (for example the presence and position of workstations) and/or the characteristics of the subjects (for example the average residence time of a worker at the workstation), it is possible, with the method described here, to identify and analyze the performances of interest and, finally, to make a preliminary estimate of these performances.

In this description, we will refer to a "risk assessment" and "risk management" during the useful life of the building, even in areas in which a risk assessment is not provided or is not carried out, defining the "risks correlated to the building" as the uncertainty in reaching the objectives, that is, in this case, in reaching the correspondence to requirements with performances of the building.

Therefore, as described above, the requirements to which the building will have to respond with at least acceptable performances will be qualitatively described in the form of parametric models relating to risks or performances, in correspondence with each area.

The method 100, the program and the apparatus 10 can be able to carry out an objective assessment of the corresponding risks and performances of the building or a part thereof, relating to one or more selected areas of investigation, and to keep them monitored over time.

The apparatus 10 as above can be able to interface with external devices 50 able to execute one or more basic software, as shown in FIG. 1, or to execute one or more basic software.

The basic software can be a BIM or BIM compatible software for planning, designing, constructing and managing buildings by means of Building Information Modeling tools. By way of example, it can be a BIM modeling software, such as Archicad, Revit, Allplan. As another example, in some phases following the design, the program can also be used in synergy with other software, such as management software (e.g. risk management software, management software relating to plant maintenance, etc.).

The apparatus 10 can be able to receive at entry from the basic software information relating to the objects that a building consists of.

Such objects and subjects are described by means of parameters in parametric models.

The apparatus 10 can comprise one or more processing units 11, or CPUs, and one or more electronic memories 12.

It can also comprise a graphic interface 13.

It can also comprise devices 15 for interfacing with a user 200, such as displays, mouse, keyboards, printers, and communication systems 16, wireless or wired, to communicate with subsequent processing systems, external storage systems, cloud systems, databases and suchlike, such as modems, Bluetooth ports or signal cables or any other form of communication device whatsoever. It can therefore interface with the user 200 to receive input information relating to areas of application, subjects, or any additional information relating to the objects.

For example, the one or more processing units 11 can be any form of computer processor whatsoever that can be used in the IT field to process data, advantageously in the field of building design.

The one or more memories 12 can be connected to the one or more processing units 11 and be one or more of those commercially available, such as a random access memory (RAM), a read only memory (ROM), floppy disc, hard disk, mass memory, or any other form whatsoever of digital storage, local or remote.

The one or more memories 12 can possibly comprise an electronic database 17. According to alternative forms, the database 17 is an external database, or an external database and an internal database can cooperate for data storage. The external database as above can also be comprised in the basic software.

According to some embodiments, the apparatus 10 can comprise auxiliary circuits (or I/O) 14, such as interfacing circuits with external power supply systems, automatic backup systems, and suchlike. The auxiliary circuits 14 can also be connected to the one or more processing units 11 to help them in a conventional manner. The auxiliary circuits can comprise, for example, at least one of either: cache circuits, power supply circuits, clock circuits, input/output circuitry, subsystems, and suchlike.

According to some embodiments, the one or more processing units 11 are provided with a modeling module 18 configured to detect the data relating to the building, entered by the user 200 by means of the interfacing devices 15 and/or stored in the database 17, and to use them to build a model of the building itself (BEAM model).

The modeling module 18 can build the model as above by detecting, in one step 1 (FIG. 2), data relating to the building or a part thereof and composing them according to a predefined system of relationships These data can be parametric models of objects and/or subjects stored in the database 17 and/or the data entered by the user 200 relating to locations, objects, subjects, risks and/or performances.

The parametric models of locations, objects, subjects, risks and/or performances can be predefined and/or modifiable by the user 200 and contained and/or identified in one or more corresponding tables and/or libraries, and/or databases and/or transformation functions.

The transformation functions can comprise any method to transform data whatsoever, for example based on physical laws or regulatory guidelines or suchlike, such as mathematical functions, look-up tables and suchlike.

The tables and/or libraries and/or databases and/or transformation functions can be stored in one or more electronic memories 12.

According to some embodiments, the one or more processing units 11 are provided with an analysis module 19.

The analysis module 19 can use the model created by the modeling module 18 to carry out a step 2 (FIG. 2) of objective assessment of the risks of the building or a part thereof on the basis of a set of relationships between the characteristics of the objects that characterize the model (object-object relationship) and/or between objects and subjects. This step 2 is carried out preliminarily and in advance of the construction of the building and/or the execution of a modification to the building itself. Here and in this description, with the expression "modification to the building" we mean both modifications to the objects that characterize it, that is, components, and also any objects that characterize its locations, such as for example furnishings, lighting fixtures or similar and comparable elements.

According to some embodiments, the analysis module 19 can support the modeling module 18 in the step of identifying one or more locations, characterized and identified by the objects of which they consist, and one or more subjects.

The analysis module 19 can also execute a possible monitoring step 3 (FIG. 2), both with reference to the risks assessed and also to the corresponding performances: the user 200 can compare the possible state of affairs ascertained on site with the expected level of risk and/or performance and then verify the level of achievement of any performance objectives and/or the acceptability of the situation detected.

According to some embodiments, the one or more processing units 11 are provided with a virtual representation module 20.

According to some embodiments, the one or more processing units 11 are provided with a synchronization module 25.

The graphic interface 13 can comprise a graphic processing unit 21, a GPU (Graphic Processing Unit) memory 22, a graphic data entry module 23 and a virtual graphic module 24.

According to some embodiments, the data entry module 23 is configured to cooperate at least with the interfacing devices 15, the one or more electronic memories 12 and the modeling modules 18, and to allow the operator to enter data relating to the building and/or select data possibly proposed by the modeling program, such as default elements or predefined lists of information. According to some embodiments, the virtual graphic module 24 can be configured to cooperate at least with the basic software and/or with possible virtual representation modules 20 to create and propose to the user the virtual environment related to the model.

According to some embodiments, the program (or computer instructions or code for computer program or software) and/or the one or more basic software can be stored in the one or more electronic memories 12 and readable by the processing unit 11 in order to implement the method 100 according to the present description.

According to some embodiments, the program can comprise a modeling program configured to detect data relating to a building and to create a model of the building and an analysis program configured to carry out and/or plan an objective assessment of the risks and performances of the building or a part thereof and monitor the progress over time of the risks and performances of the building comparing the model with detections and measurements performed on site or with data obtained with other detection systems.

The program can also comprise a virtual representation program.

The virtual representation program can be configured to represent the model supplied by the modeling program in a virtual environment.

According to some embodiments, the program can be used alone or in synergy with the one or more basic software. The program can be used in synergy with the basic software in order to draw on parametric models relating to objects and/or for a possible virtual representation of the model.

The program can be started by the user 200 with two different purposes: with each modification of the BIM project, that is, with each modification of the objects that the BIM model consists of, in order to verify the quality of their performance in a specific area of application, to possibly choose the solutions deemed most effective and to create or update a BEAM model, or, once a BEAM model has been completed and a work constructed, in order to verify the state of affairs ascertained on site in correspondence with the model and monitor the progress of risks and performances over time, updating any objectives to be reached on each occasion. It is understood that the user 200 can use the program described here to have an objective method to assess the validity of any changes in the locations to be made, whether or not they involve a new step of designing the building, for example even moving a workstation or assessing furnishing solutions within a room.

The modification of the objects can be carried out by means of the basic software, according to the basic mode MOD. A (FIG. 2), or during the interaction between the program and the basic software, according to the alternative mode MOD. A1 (FIG. 2*a*), or modifications and insertions of objects can be made directly from the program.

Some embodiments disclosed here concern a method 100 to design buildings.

The method 100 can provide to execute, by means of a modeling module 18, a modeling of the building or a part thereof, detecting the data relating to the building, entered by the user 200 and/or stored in a database 17, and using the data to build a model.

The method 100 can therefore provide to execute, by means of an analysis module 19, an analysis of the building modeled by the modeling module 18, comprising the objective assessment of the risks of the building or a part thereof, relating to one or more areas of investigation, and of performances correlated to these risks, on the basis of a set of relationships between the characteristics of objects and/or between the characteristics of objects and subjects that interact with such objects.

This assessment can take into account one or more areas, by way of a non-exhaustive example, only the HS area or the HS and Accessibility areas at the same time.

For example, an object can be a "floor" and its possible characteristics, or parameters, can be the type of floor (such as a tile), sizes, material, color and suchlike.

On the other hand, a subject can be, for example, the "visitor" to a structure, and the parameters that identify it can be gender, height, weight, average path followed in the location or areas of the structure to which it has access and suchlike.

Figure 2:
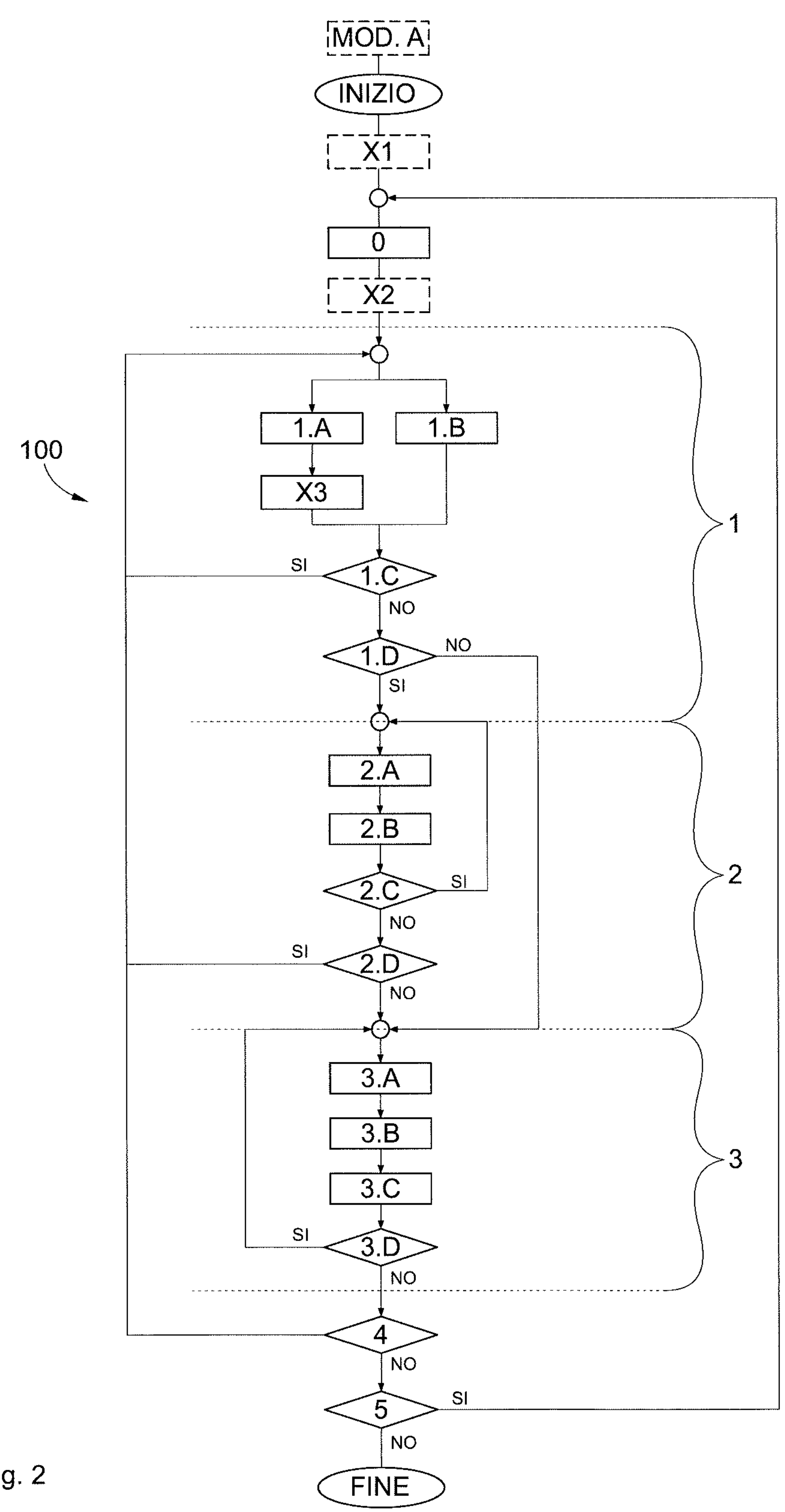
FIG. 2 is a flowchart of a method to process data according to some embodiments described here.

According to some embodiments and as shown in FIG. 2, the modeling can comprise a preliminary step 0 of choosing the one or more areas of application that a user 200 will be able to select.

The modeling can also comprise a step 1 of identifying one or more locations, one or more subjects.

According to some embodiments and as shown in FIG. 2, the analysis of the building obtained from the modeling can provide a step 2 of assessing the one or more risks (and the correlated performances) and, possibly, a step 3 of monitoring the state of affairs, with reference to the risks and/or performances assessed.

According to some embodiments, the area of application determines the system of relationships to be built and investigated (that is, the risks and performances of the building), as well as the type and characteristics of the subjects.

According to some embodiments, step 1 can provide the following actions, in which the order in which such actions are presented is not binding for their execution:

action 1.A: choice and/or modification of one or more locations for which the user 200 executes the program;

action 1.B: choice and/or modification of one or more subjects or families of subjects by the user 200.

According to some embodiments, the method can provide that the locations are characterized and identified as a function of the objects of which they consist, by the parameters that distinguish them and by the position thereof in the model.

The locations as above can be represented as virtual environments in order to facilitate their identification by the user 200.

The locations can be identified by the objects that, transposed into the real world, would determine their boundaries (e.g. walls, floors, doors) or by the selection of a portion of the building by the user 200. It is understood that the locations are delimited by such objects and that the parameters of the objects can characterize the locations as above.

For example, the virtual environment "bathroom" can be identified by the objects that delimit it, that is, vertical and horizontal closures (structures, partitions, plasterboard, surface finishes, internal and external doors and windows and suchlike), and characterized by the systems (electrical, mechanical and suchlike) or by the fixed apparatuses installed (lighting fixtures, sanitary fixtures and suchlike). By way of example, the slipperiness coefficient of the floor tiles is a characteristic of the location "bathroom".

According to some embodiments and as shown in FIG. 2, the method can provide that the locations are characterized and identified as a function of the objects of which they consist, by the parameters that distinguish them and by the position thereof in the model. This characterization and identification of the locations can occur (block X3) following action 1.A, that is, choice and/or modification of the locations by the user. In some variants, the characterization and identification of the locations can occur during the previous steps, immediately at the program start (block X1) or after the preliminary step 0 (block X2), such blocks X1 or X2 representing the variants being indicated in FIG. 2 in dotted mode.

Figures 2A, 2B, 2C, 2D, 2E:
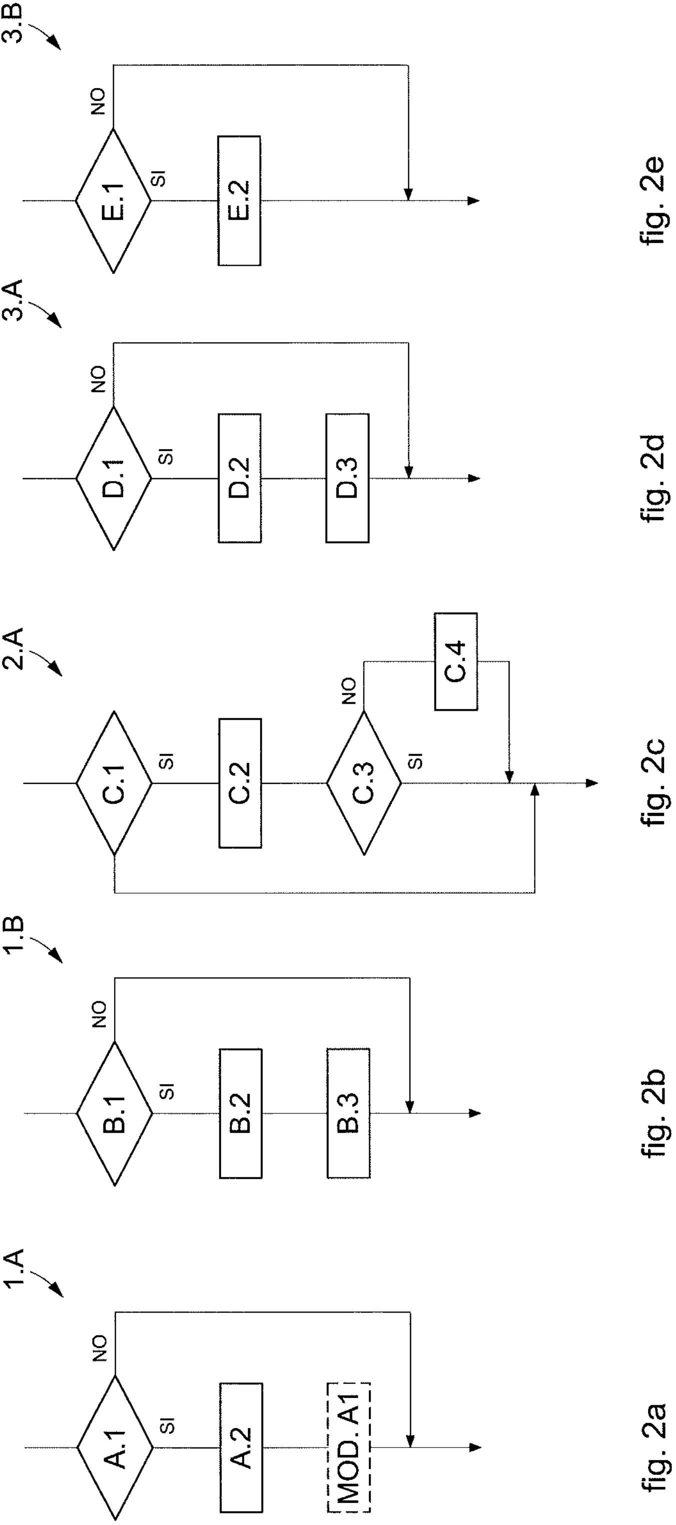
FIGS. 2*a*, 2*b*, 2*c*, 2*d* and 2*e* represent the flow diagram of actions of the method of FIG. 2.

The method 100 can provide that locations, objects, subjects, risks and/or performances, defined on the basis of their parametric models, are predefined and contained and/or identified in one or more corresponding tables and/or libraries and/or databases and/or transformation functions: the objects can be defined in advance by the basic software and can be possibly and at least partly modified by means of the interaction with the basic software (MOD.A FIG. 2 and/or MOD.A1 in FIG. 2*a*).

In one variant of the method 100, the program can provide to modify, as well as define some objects, such as for example furnishings, lighting fixtures or suchlike, objects that may not be comprised in the starting BIM model, which could be moved, modified and/or inserted directly from the program.

The method 100 can also provide that locations and/or subjects contained and/or identified in one or more corresponding tables and/or databases and/or calculation techniques can be modified by the user 200 (FIGS. 2*a* and 2*b*).

The method 100 can also provide that the user 200 defines new locations and/or subjects (FIGS. 2*a* and 2*b*). In this case, the user 200 can be asked to:

select, within graphic and/or virtual representations of the model, the locations of interest in the BIM model;

enter all the parameters required by the parametric model of the subject as a function of the areas of application.

Depending on the one or more areas chosen, the parameters of interest can be different: for example, in the HS area, the object "sink" in relation to a subject "visitor" can involve a "risk of slipping" (the floor could be accidentally wet); in this case, in order to assess the extent of the risk, it will be important to know the characteristics of adhesion of the object "floor". In the Accessibility area, the physical characteristics of the "sink" can constrain, or not, the possible use of the environment or of the sink itself by disabled people in a wheelchair (risk of non-accessibility by a subject): in this case, in order to assess the extent of the risk, the position and sizes of the object "sink" in the location "bathroom" take on great importance. It is clear that the characteristics of the "sink" are taken into account differently as a function of the use or area (HS or Accessibility).

The method 100 can therefore provide that, depending on the area, subgroups of parameters of interest are automatically created. For example, in the HS area, the program can recognize and associate common characteristics with locations and/or objects as a function of the use made of them and/or the chosen area (for example, with the locations "corridor" and "entrance" it can associate the use "traffic routes"—with a "chair" and "a stool" the use "seat").

The method 100 can require the user 200 to enter and/or modify some parameters of objects and/or subjects if these are missing or inconsistent for program execution: for example, the characteristic of an object is not described in the starting BIM model.

The method 100 can provide that, in actions 1.A and 1.B, the user 200 can choose (steps A.1, B.1 in FIG. 2*a*, 2*b*) whether to make the selection (steps A.2, B.2 in FIG. 2*a*, 2*b*) and/or the modification (steps MOD.A1 in FIG. 2*a* and B.3 in FIG. 2*b*) or whether to accept the default settings proposed by the method 100.

The method can provide to go back and perform an action 1.A or 1.B not performed or repeat it, or to continue (Action 1.C).

These default settings can be defined on the basis of the probability that a determinate choice can be of interest, for example for the legislation of a certain country or for a determinate category of buildings or user bases correlated thereto, or they can be defined by the user 200 in a possible initial step of setting the method 100, or with similar modes.

The method 100 can also provide that the definition of the types of parameters of the subjects is specific to the aspects to be investigated. For example, if the subject is a "person with motor disabilities", the parameters can include the overall size of a wheelchair, the inability to go over a step independently, an operating area to engage with objects from a sitting position, and suchlike.

As another example, for a subject "worker", in addition to the parameters previously seen for the subject "visitor", it is possible to take into consideration the "residence time" in the workplace, in order to verify the possible exposure to health risks of the job during the residence period (e.g. exposure to electromagnetic fields of a subject "employee" at the workstation at the video terminal).

The method 100 can provide that families of subjects representing the characteristics of a category are also predefined. For example, in the Accessibility area, a disabled subject could represent the characteristics of a subject with motor disabilities, but also of other subjects with sensory or cognitive disabilities.

According to some embodiments, the method 100 can provide that the analysis module 19 supports the modeling module 18 in the step of identifying one or more locations, characterized and identified by the objects of which they consist, and one or more subjects (for example in the identification of subgroups of parameters of interest of locations, objects and/or subjects).

According to some embodiments, the method 100 can provide the choice of executing step 2 or going directly to step 3.

According to some embodiments, the method 100 can provide that, in step 2, an assessment of the risks and performances of the building is associated with the data selected by the user 200, and with the position of objects and/or subjects in the model (action 2.B in FIG. 2).

The method 100 can provide that such association is carried out by means of calculation algorithms based on one or more of either physical laws, mathematical formulas, correlation tables, probability distributions or suchlike.

In particular, the method 100 can provide to relate the parameters of the one or more locations with those of the one or more selected subjects, for example a relationship between objects and objects and/or between objects and subjects, using the calculation algorithms. It can then provide to compare the value obtained with the reference levels for each risk or performance and to measure the extent of the risk or the level of performance required. By way of clarification, the parameters or subgroups of parameters of interest of the locations (parametric models equated to objects), of the objects that characterize them and/or of other objects that can be affected by the relationship and/or of the subjects can be related, as a function of their reciprocal position.

For example, in the HS area, many algorithms for calculating exposure to a risk are already defined by regulations, standards or guidelines (e.g. exposure to noise or electromagnetic fields) and are simply applied to the model, on the basis of the position in which the datum is to be obtained as a function of the characteristics of the surrounding objects.

These calculation algorithms can be predefined by the method 100 and applied to the model as a function of the subjects and their permanence in a position and/or possible paths within the virtual environment.

The application of these calculation algorithms can possibly also require the use of artificial intelligence technologies.

In some cases, the extent of the risk and/or the level of the performance can be calculated (by applying calculation algorithms) solely as a function of the parameters or subgroups of parameters of interest that distinguish objects and/or locations and/or their position in the model, without needing to establish specific relationships between objects or between objects and subjects (similar to a process of validating requirements by means of code checking in a BIM environment). In the simplest cases it can be carried out by means of a simple comparison between parameters that distinguish locations and/or objects with the defined reference levels.

Although in some cases the process used to complete the risk assessment can be similar to code checking, the method is not intended as a tool for validating BIM requirements (however, it can be used to support the design in this perspective, to carry out a project validation check in specific areas), but for risk assessment, for estimating the performances of the building as a function of the characteristics and of the position of the objects that determine it and the use that is made of it.

The risk assessment criteria, as well as the performance reference levels, in correspondence with the entity of the risk, will be predefined within the program; however, the user 200 will have the possibility to modify them (action 2.A FIG. 2) before associating with the data chosen by the user 200 the assessment of the risks and of the performances of the building in action 2.B.

The reference levels can be predefined as a function of the scope of application: determinate performance levels or a range of performance levels of the building can correspond to the entity of a risk assessed (and vice versa).

The method 100 can provide a continuous variation in the level of risk and/or performance, or a discrete variation. Preferably, risks and performances can be defined in a discrete manner by defining reference levels of risk or of performance, for example a number of levels lower than ten, preferably between two and five.

By way of example, the levels of exposure to a risk could be high—medium—low level, and for performances, in view of monitoring over time, insufficient—sufficient—good—excellent.

The method 100 can provide one or more modes for setting the reference levels, for example as a function of what described in laws, regulations or reference standards, guidelines, good practices, and/or as a function of the results obtained by calculation algorithms applied to significant samples, and/or also as an arbitrary choice of the user 200 to better adapt the assessment to his/her needs and operating modes adopted over time.

The method 100 can provide that the user 200 chooses (step C.1 of action 2.A in FIG. 2*c*) whether to use the "reference levels" predefined by method 100 or whether to modify them (step C.2 of action 2.A in FIG. 2*c*).

According to some embodiments, the method 100 can provide that the "acceptable" extent of the risk and/or the "acceptable" level of performance are predefined by the program: the user 200 can modify the levels of risk and/or performance that are deemed "acceptable".

The method 100 can provide (step C.3 of action 2.A in FIG. 2*c*) to not allow to define as "acceptable" those levels of performance that are below the limits imposed by law and to report (step C.4 of action 2.A in FIG. 2*c*) the inconsistency to the user 200 and/or report any incoherencies in correspondence with the choice of reference levels that are not physically possible or attainable and therefore not concretely identifiable or practicable.

The method 100 can provide to make available to the user 200 the possibility of restoring the reference levels set by default by the program and possibly allow to save previous defined configurations.

According to some embodiments, the method 100 can provide that for each area of application chosen, there is predefined a series of risks and performances of the building, which can be assessed in the one or more locations and one or more subjects selected.

The program can put the user 200 in the position to choose (e.g. by means of a drop-down menu flag) the mode with which the results are displayed, for example organized as a function of the location, the subject or sorted by risk or performance.

The user 200 can choose to display the results of the assessment in correspondence with all the locations, subjects selected and all the risks or performances of the chosen areas of investigation, or to select single locations, subjects, risks or performances.

The method 100 can provide that it is also possible to carry out an assessment aimed only at a specific position of the subject within the virtual environment.

The data can be displayed in the form of a table and/or graphical representation (e.g. plan view of a building) and/or within the virtual environment, for example by means of different colors of the areas in correspondence with different levels of risk or performance.

By way of example, in the HS area, having defined an "office" as the location, it is possible to consider examining the single risk of exposure to electromagnetic fields, as a function of the residence time of the subject "employee" at his/her workstation, characterized by the presence around an electric panel, electric systems, electric apparatuses (which can determine exposure to an electromagnetic field).

The method 100 can provide to supply, together with the risk/performance assessment, possible boundary conditions of use of the environment or objects, that is, indications to be respected/useful information for the subsequent management and use of the work, for example to maintain the level of the performances. Examples of boundary conditions can be: compliance with the capacity of a floor, the maximum residence time at a workstation, the maximum number of visitors per day for a structure.

For example, in the HS area, the boundary conditions can correspond with the prevention and protection measures.

Generally, the boundary conditions are predetermined by the characteristics of the objects and/or locations and/or subjects, as indicated above, or determined as a result of the assessment, although in part they can be indicated by the user, as explained below.

In particular, the analysis module as above, during the objective assessment step, can allow a user, with reference to the risks and/or performance assessed, to:

- verify and indicate boundary conditions, that is, information relating to the modes of use of the building; and
- leave warnings relating to unresolved situations (a sort of clash warning), for example if there is not a sufficient amount of information relating to the objects (for example, a notification received from the program), or to situations that can be better resolved with the use of other or alternative technological solutions or with management measures, aimed at the subsequent life or management phases of the building, for example solutions that could significantly improve the performances of the building but which cannot be adopted at the time of the assessment.

The one or more electronic memories 12 can store these boundary conditions and warnings in the model.

The boundary conditions as above can optionally be integrated and displayed in a virtual environment of the building by means of the interaction with a basic software and/or the dedicated virtual representation module 20, or the user 200 can choose whether to display them in a virtual environment.

As a function of the level of performance measured and the boundary conditions, for each aspect analyzed, the user 200 can choose (action 2.C in FIG. 2) whether to consider the result obtained satisfactory, in correspondence with the boundary conditions of use, or whether to consider the result unsatisfactory or improvable, and therefore:

- repeat the assessment, modifying and/or updating the boundary conditions;
- repeat the assessment, modifying the risk assessment criteria, that is, the reference levels adopted;
- accept the result obtained from the assessment, for example because the user believes he/she does not have sufficient information in correspondence with the objects or subjects, or believes that the assessment can be further perfected at a later time. In this case, the method 100 provides that during the assessment the user 200 can indicate the need/opportunity to provide additional boundary conditions in the subsequent life stages of the building, and possibly suggest them.

The user 200 can also choose to once again repeat step 1 of choosing and/or modifying the locations and subjects (action 2.D FIG. 2), including the insertion/modification of possible objects.

According to some embodiments, the method 100 can provide to save the choices made by the user 200, once step 2 of assessment is concluded: the modeling module 18 can complete the BEAM model with the results of the assessment of risks and performances, the corresponding reference levels, as well as the boundary conditions defined, and any warnings aimed at the subsequent phases. Once completed, the BEAM model can be saved in one or more electronic memories 12.

In this way, the method 100 allows the user 200 to save the various BEAM models relating to the building over time, and to use them to carry out virtual simulations of the real world and/or to verify compliance with the state of affairs detected in the course of the management and maintenance of the artefact.

The method 100 can provide to define, by means of a virtual representation program or the basic software, a virtual environment of the BEAM model, for example a 3D model, inside which the subjects can be moved. The location can therefore be represented as a virtual environment.

The method 100 can provide to move the subjects on virtual cognitive paths of the structure, predefined by the program as a function of the subject or chosen by the user 200.

The virtual environment can be exploited by the user 200, once an assessment has been completed, to simplify the interpretation and display of the results, for example by moving a subject within the virtual environment and displaying the variation of a performance or of the performance levels (for example by selecting which performances to display), highlighted with different colors, as a function of the position in which it is located: the virtual environment can be used by the user 200 also to organize virtual cognitive paths of the building and of the boundary conditions, aimed at third parties (for example represented virtually by the subjects).

In one variant, the model 100 can provide to define and move some objects and/or interactions of the subject with some objects, simulating physical reality in a virtual environment. For example, a subject can, within the virtual environment, move some objects.

According to some embodiments, step 3 can provide the possibility for the user 200 to manage a possible monitoring of the risks and/or performances of the building: step 3 as above can be executed by the analysis module 19.

In particular, in step 3, the method 100 can provide, in action 3.A, to allow the user 200 to choose (step D.1 FIG. 2*d*) whether to enter and/or update (step D.2 FIG. 2*d*) the performances ascertained on site (for example from detections or measurements) or whether to refer to previous states of affairs: the data relating to these performances can be drawn from the database 17 and/or entered directly by the user 200.

The method 100 can provide to synchronize the data entered with the model (step D.3 FIG. 2*d*) by means of the synchronization module 25. The entry and/or updating and/or synchronization of the performances ascertained on site, for example if carried out by means of a comparison with data detected by component tracking systems, can possibly require the aid of artificial intelligence technologies.

The method 100 can provide, in action 3.B, to allow the user 200 to choose (step E.1 FIG. 2*e*) whether to insert and/or update (step E.2 FIG. 2*e*) possible objectives that he/she aims to achieve (e.g. maintenance or improvement of performance levels over time).

According to some embodiments, step 3, in action 3.C, can provide the possibility for the user 200 to verify the state of affairs ascertained on site in accordance with the BEAM model (situation relating to risks and performances measured on site) and the level of achievement of any defined objectives, that is, the desired performance levels: as a function of the objective results obtained, the user can choose how to continue managing the building and the resources correlated thereto and/or to proceed with further updates of the model and/or to proceed with the new definition and/or confirmation of the objectives.

The user 200 can choose (action 3.D in FIG. 2) whether to deem the result obtained satisfactory or whether to repeat step 3.

Also in step 3, the user 200 can choose (e.g. by means of a drop-down menu flag) the display mode of objectives, level of achievement thereof, for example organized according to the location, the subject or sorted by risk or performance or objective or level of achievement: the user 200 can also choose to display this information in correspondence with all the locations, selected subjects and all the risks, performances of the chosen areas of investigation and objectives, or to select single locations, subjects, risks, performances or objectives.

The method 100 can also provide to save the choices made by the user 200 in order to allow to display the state of affairs detected at any time, that is, the level of performance detected as a function of the BEAM model adopted, and/or the level of achievement of the objectives: the state of affairs achieved can be saved in the one or more electronic memories 12.

In this way, the method 100 allows the user 200 to save the different states of affairs recorded over time and to monitor the progress of the performances of the building and the level of achievement of the objectives over time.

In one variant of the method 100, by applying a time schedule to the objects, it is possible to also extend the assessment of risks and performances, as well as the monitoring of the states of affairs, to the building under construction.

The method 100 can therefore provide a possible new selection and/or modification of the locations, subjects (step 4 in FIG. 2) and/or the scope of application (step 5 in FIG. 2).

It is clear that modifications and/or additions of parts or steps may be made to the method 100 to process data, to the data processing program and to the electronic apparatus 10 as described heretofore, without departing from the field and scope of the present invention as defined by the claims.

In the following claims, the sole purpose of the references in brackets is to facilitate reading: they must not be considered as restrictive factors with regard to the field of protection claimed in the specific claims.

The invention claimed is:

1. A computer implemented method (100) to process data relating to a building, said method being based on information models, or compatible with BIM (Building Information Modeling), and being wherein it provides to execute a processing by means of an electronic apparatus (10), said electronic apparatus (10) comprising at least one or more processing units (11) and one or more electronic memories (12), said one or more processing units (11) being provided with a modeling module (18) and an analysis module (19), wherein said processing executed by said method provides that:

said modeling module (18) executes a modeling of the building or a part thereof, which comprises step (1) of identifying one or more locations, characterized and identified by the objects of which they consist, and one or more subjects;

said analysis module (19) executes an analysis of the building or a part thereof modelled by said modeling module (18), by means of step (2) of objective assessment of one or more risks and performances relating to the building, processing by means of calculation algorithms, based on one or more of physical laws, mathematical formulas, correlation tables, probability distributions, a set of relationships between the characteristics of said objects and/or between characteristics of said objects and subjects that interact with said objects;

said method executing an assessment of a level of response of the building with performances to determine requirements in different areas of investigation, taking into account the intended use of the building; and said method executing, on the basis of said modeling and said analysis of the building or a part thereof and on the basis of said assessment of the building response level, a predictive/decision-making activity of the design choices relating to the building based on data relating to all life stages of said building;

wherein said one or more risks related to the building correspond to the uncertainty in reaching correspondence to determine requirements with performances of the building as a function of the needs relating to one or more areas of investigation;

wherein the requirements referring to each area of investigation, to which the building responds with respective performances, are explained and described qualitatively with parametric models in the form of risks or performances.

2. The method (100) as in claim 1, wherein said modeling module (18) executes a preliminary step (0) of choice, by a user (200), of one or more fields of application.

3. The method (100) as in claim 1, wherein it provides that said analysis module (19) during said step (2) of objective assessment allows a user (200), with reference to the risks and/or performances assessed:

to verify and indicate boundary conditions, that is, information relating to a mode of use of the building; and to provide warnings relating to unresolved situations or to situations that can be better resolved with the use of additional or alternative technological solutions or with management measures, aimed at the subsequent life or management phases of the building;

wherein it provides that said one or more electronic memories (12) store said boundary conditions and warnings within the model;

wherein said boundary conditions are integrated and displayed in a virtual environment of said building by means of the interaction with a basic software and/or a dedicated virtual representation module (20).

4. The method (100) as in claim 1, wherein it provides that said analysis module (19) also executes a monitoring step (3), which allows a user (200):

to verify, at any time in the useful life of the building, the state of affairs relating to risks and performances of the building ascertained on site, by means of detections and/or measurements or other detection systems, in correspondence with the model;

to define possible objectives for maintaining or improving performance levels and/or the extent of risks;

in order to monitor the progress over time of the risks and performances of the building and, as a function thereof, plan interventions aimed at maintaining efficiency and/or improvement.

5. The method (100) as in claim 1, wherein it provides that said assessment step (2) is carried out preliminarily and prior to the construction of the building and/or to carrying out a modification to the building itself, wherein said modification to the building includes modifications to the objects that characterize it and/or modifications to the objects that characterize its locations.

6. The method (100) as in claim 1, wherein the parametric models of locations, objects, subjects are contained and/or identified in one or more corresponding tables and/or databases and/or transformation functions stored in the one or more electronic memories (12), wherein said tables and/or databases can possibly and at least partly be modified by a user (200).

7. The method (100) as in claim 1, wherein said step (1) of identifying locations and subjects relating to the building include:

(1.A) choice and/or modification of the one or more locations by a user (200); and (1.B) choice and/or modification of the one or more subjects or families of subjects, identified by a series of parameters or characteristics.

8. The method (100) as in claim 3, wherein it represents, by means of interaction with the basic software and/or the virtual representation module (20), said locations with a corresponding virtual environment wherein the subject can be moved within said virtual environment and be located in relation to the objects that characterize the location.

9. The method (100) as in claim 1, wherein said analysis module (19) supports the modeling module (18) in the step of identifying one or more locations, which are characterized and identified by the objects of which they consist, and one or more subjects.

10. An electronic apparatus (10) configured to interface with a user (200) to receive at input data relating to a building and configured to execute a method as in claim 1, said apparatus comprising one or more processing units (11) and one or more electronic memories (12), said one or more processing units (11) being provided with a modeling module (18) and an analysis module (19).

11. The electronic apparatus (10) as in claim 10, wherein said one or more processing units (11) comprise a virtual representation module (20).

12. One or more electronic memories (12) storing computer executable instructions that, when executed by a processing unit (11) of an electronic apparatus (10) cause the processing unit to perform the method as in claim 1, said computer executable instructions comprising a modeling program, configured to detect data relating to a building and to produce a model of said building, and an analysis program configured to carry out an objective assessment of the risks and performances of the building or of a part thereof and monitor the progress over time of the risks and performances of the building comparing the model with the detections and measurements performed on site.

* * * * *